United States Patent [19]
Ohba et al.

[11] 4,438,469
[45] Mar. 20, 1984

[54] DEFLECTABLE TRANSDUCER MOUNTING ASSEMBLY

[75] Inventors: Takeo Ohba, Sagamihara; Hirohisa Koga, Zama, both of Japan

[73] Assignee: Sony Corporation, Tokyo, Japan

[21] Appl. No.: 304,786

[22] Filed: Sep. 23, 1981

[30] Foreign Application Priority Data

Sep. 30, 1980 [JP] Japan .................. 55-136014

[51] Int. Cl.³ .................................. G11B 21/18
[52] U.S. Cl. ..................................... 360/109
[58] Field of Search .............. 360/70, 77, 76, 78, 360/107, 109

[56] References Cited

U.S. PATENT DOCUMENTS 4,099,211 7/1978 Hathaway .................. 360/109
4,233,637 11/1980 Kubota ..................... 360/70 X
4,326,228 4/1982 Sakamoto .................. 360/109

*Primary Examiner*—Joseph A. Popek
*Attorney, Agent, or Firm*—Lewis H. Eslinger; Alvin Sinderbrand

[57] ABSTRACT

A deflectable transducer mounting assembly for mounting a transducer on a member, such as a rotatable member. A first deflectable element has one end thereof coupled to the member so as to be cantilevered outward therefrom, and a free end on which the transducer is mounted. The first deflectable element is deflectable in response to drive signals supplied thereto. A pair of second deflectable elements, which also are deflectable in response to drive signals supplied thereto, are disposed at the one end of the first deflectable element so as to sandwich that one end therebetween. The pair of second deflectable elements are adapted to be secured to the member. In a preferred embodiment, the first deflectable element is comprised of a pair of elements whose free ends are interconnected via a support element which is flexibly coupled to each of such free end; and the one end of each of these pair of elements is sandwiched between a respective pair of the aforementioned second deflectable elements.

15 Claims, 11 Drawing Figures

DEFLECTABLE TRANSDUCER MOUNTING ASSEMBLY

BACKGROUND OF THE INVENTION

This invention relates to a deflectable transducer mounting assembly and, more particularly, to such a mounting assembly which is particularly adapted for use in helical type video tape recorders (HVTR) which permits a previously recorded track of video information to be scanned accurately during special playback modes of operation, such as stop, slow motion, and reverse modes of operation.

Helical-type video tape recorders are known wherein video signals are recorded in, for example, successive fields in consecutive tracks which are arranged obliquely across a magnetic tape. In some of these VTR's the consecutive tracks are separated by guard bands; and in other VTR's, the recording density is increased by minimizing or even eliminating such guard bands. During normal recording and reproducing modes of operation, the drive apparatus which is used to transport the magnetic tape and the rotary drive apparatus which is used to rotate the magnetic transducers which record/reproduce video signals on the tape are controlled by servo systems, whereby the tape is driven uniformly, the transducers are rotated uniformly, and parallel oblique record tracks are recorded/reproduced.

However, during special modes of reproduction, such as during stop, slow-motion and reverse-motion modes, the tape-drive and rotary-drive servo systems may not be capable of controlling tape and head movement satisfactorily such that a previously recorded record track is scanned accurately during such modes. It is appreciated that, during such special modes of reproduction, the transducers are rotated at the same speed as during the normal mode of reproduction. However, since the magnetic tape is transported at a slower speed, or in the reverse direction, or is stopped completely, the resultant scanning trace of the transducer across the magnetic tape does not coincide with the previously recorded record track. During slow-motion, reverse-motion and stop modes of reproduction, the angle between the resultant scanning trace of the transducers and the longitudinal axis (or tape-movement direction) of the tape is greater than the angle between the pre-recorded track and this axis. Conversely, during a fast-reproduction mode of operation, the scanning trace makes a smaller angle with the longitudinal axis than the pre-recorded track. For proper reproduction of the video signals during such special modes it is important to provide some means by which the angle of the scanning trace is made to coincide with the angle of the pre-recorded track.

In recognition of this need to conform the scanning trace of the transducers during special modes of reproduction with the previously recorded record tracks, various proposals have been made to bring the scanning trace and record track into alignment. For example, in U.S. Pat. Nos. 3,787,616; 4,141,047; and 4,203,140, the use of deflectable members, such as so-called bi-morph leaves, has been proposed, wherein transducers are mounted on such deflectable members which are deflectable in a direction substantially transverse of the scanning trace. When the transducer scans a record track, deviations between the scanning trace and the record track are detected and used to produce tracking error signals. These tracking error signals are, in turn, utilized to generate drive signals that are applied to the deflectable member so as to cause deflection thereof in a direction which brings the transducer into alignment with the record track, thereby nulling the tracking error signal. Typically, the bi-morph leaf which comprises the deflectable member is formed of piezo-ceramic material that is particularly polarized so as to bend in a direction dependent upon the polarity of an electric field produced thereacross in response to the drive signals supplied thereto, the magnitude of such bending being determined by the magnitude of the electric field.

When the deflectable member bends, the face of the transducer mounted thereon generally is displaced relative to the surface of the magnetic tape so as to form an angle between that surface and the face of the transducer. The size of this angle is a function of the bending, or deflection, of the deflectable member. In an attempt to maintain a constant angle between the face of the transducer and the surface of the tape, it has been proposed, in U.S. Pat. No. 4,099,211, to divide the deflectable member into separate sections, each section being formed of pieze-ceramic material having different polarization directions such that a drive signal supplied to all sections results in an "S" deflection of the member. This allows the transducer to be displaced in a direction generally transversely of the scanning trace so as to correct for tracking errors, while maintaining a substantially constant angle between the face of the transducer and the surface of the magnetic tape.

In the proposals described in all of the aforementioned patents, the deflectable member is secured at one end thereof to a rotary member, such as the rotary drum of a typical HVTR, so as to be cantilevered outward therefrom. Consequently, the maximum bending angle of the deflectable member, which determines the maximum displacement of the transducer, is a function of the length of the bi-morph leaf and the magnitude of the drive signals supplied thereto. While satisfactory bending angles can be attained, during slow-motion and stop-motion reproducing modes with bi-morph leaves of acceptable length to which are supplied drive signals of acceptable magnitudes, substantially greater bending angles must be provided to achieve proper tracking of the transducer during fast-motion and reverse-motion reproducing modes. If the bi-morph leaf is made longer so as to achieve such greater bending angles, the resultant lengthening of the bi-morph leaf is accompanied by a reduction in its natural resonant frequency. Since the speed of response of the bi-morph leaf is a direct function of its natural resonant frequency, such a reduction in natural resonant frequency results in a corresponding reduction in response speed, thereby inhibiting the ability of the bi-morph leaf to correct for tracking errors. Alternatively, if a drive signal of greater magnitude is supplied to the bi-morph leaf in order to increase the bending angle thereof without requiring a longer member, the piezo-ceramic material which constitutes the bi-morph leaf may crack or break. Consequently, there are serious constraints on the maximum bending angle which may be attained by the bi-morph leaf, these constraints being a function of the length of the bi-morph leaf and the magnitude of the drive signals which may be supplied thereto.

OBJECTS OF THE INVENTION

Therefore, it is an object of the present invention to provide an improved deflectable transducer mounting assembly which permits greater displacement of a transducer mounted thereon while avoiding the aforenoted disadvantages.

Another object of this invention is to provide a deflectable member upon which a transducer is mounted, which member is capable of achieving relatively large deflections without requiring an increase in the effective length thereof, and which is responsive to deflection drive signals of acceptable magnitudes.

A further object of this invention is to provide a deflectable transducer mounting assembly, including a deflectable member which is capable of relatively large deflections without cracking or breaking, which member exhibits a desirably high natural resonant frequency.

An additional object of this invention is to provide a deflectable transducer mounting assembly for use in a helical-scan video tape recorder, upon which a transducer is mounted and subjected to relatively large displacements while maintaining a substantially constant angle between the face thereof and the surface of the tape used in the video tape recorder.

Yet another obect of this invention is to provide a deflectable transducer mounting assembly for mounting a transducer on a rotatable member in a video tape recorder so as to enable the video tape recorder to operate in special modes of reproduction, such as slow-motion, fast-motion, stop-motion and reverse-motion modes, while accurately reproducing video signals which have been recorded previously.

Various other objects, advantages and features of the present invention will become readily apparent from the ensuing detailed description, and the novel features will be particularly pointed out in the appended claims.

SUMMARY OF THE INVENTION

In accordance with this invention, a deflectable transducer mounting assembly is provided with a first deflectable element having a first end to be coupled to a member so as to be cantilevered therefrom, and a free end on which a transducer is mounted. The first deflectable element is deflectable in response to drive signals supplied thereto. A pair of second deflectable elements, which also are deflectable in response to drive signals supplied thereto, is disposed at the one end of the first deflectable element so as to sandwich that one end therebetween. When the mounting assembly is assembled with the member, the pair of second deflectable elements is secured to that member.

In accordance with a preferred aspect of the present invention, the first deflectable element is comprised of a bi-morph leaf. In one embodiment, the pair of second deflectable elements is comprised of a pair of single-morph leaves which are formed of piezo-ceramic material having polarities which are opposite to each other. In accordance with another embodiment of this invention, the second deflectable elements are comprised of respective bi-morph leaves.

Preferably, the first deflectable element is comprised of a pair of bi-mcrph leaves whose free ends are mechanically interconnected by a support element which is flexibly coupled to such free ends, the support element having the transducer secured thereto. In this embodiment, the aforementioned one end of each bi-morph leaf is sandwiched between a respective pair of single-morph leaves or between a respective pair of additional bi-morph leaves. In yet another embodiment, the aforementioned one ends of the bi-morph leaves sandwich an additional bi-morph leaf therebetween, and this additional bi-morph leaf cooperates with respective single-morph leaves to secure the first-mentioned bi-morph leaves to a rotary member.

In all of the aforementioned embodiments, the first deflectable element bends in response to drive signals supplied thereto, and each of the second deflectable elements also bends in response to drive signals so as to increase the bending angle of the first deflectable element without increasing the actual length thereof and without requiring drive signals of relatively high magnitudes.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Figure 1:
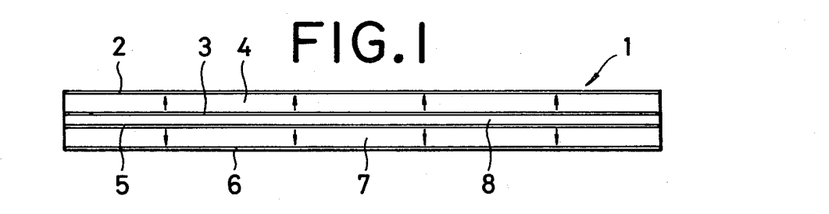
FIG. 1 is a side view of a typical bi-morph leaf which can be used as the deflectable element in the present invention.

The advantages and improved results attained by the present invention will best be appreciated if the manner in which a bi-morph leaf is used as a deflectable element is first understood. Referring to the drawings, wherein like reference numerals are used throughout, FIG. 1 is a side view of a typical bi-morph leaf which can be used as a deflectable element in a transducer mounting assembly. Bi-morph leaf 1 is comprised of two elongated strips or elements of piezo-ceramic material 4 and 7, these two strips having electrodes 2, 3 and 5, 6 coated on the respective surfaces thereof. For example, such electrodes may be coated by conventional silk-printing techniques. A shim, or vane, 8 is interposed between electrodes 3 and 5 of piezo-ceramic strips 4 and 7, respectively, as by means of a suitable adhesive. Shim 8 functions to reinforce the bi-morph leaf formed of piezo-ceramic strips 4 and 7. This shim may be formed of, for example, phosphor bronze, titanium alloy or carbon fiber. Shim 8 is conductive and serves to electrically interconnect electrode 3 of piezo-ceramic strip 4 with electrode 5 of piezo-ceramic strip 7.

Figure 2:
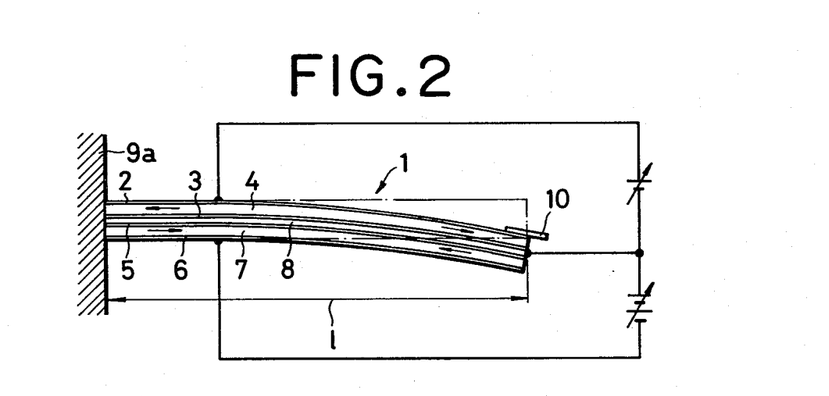
FIG. 2 is a side view of a typical deflectable transducer mounting assembly using the bi-morph leaf shown in FIG. 1.

FIG. 2 illustrates a typical use of bi-morph leaf 1 as a transducer mounting assembly in a video tape recorder (VTR). As shown, the bi-morph leaf is mounted at one end thereof to a rigid support member 9a which, typically, is included in, or comprises, the rotary drum and is provided at its free end, that is, the end remote from rotary drum 9a, with transducer 10. It may be appreciated that, in its desired environment wherein transducer 10 is utilized to reproduce video signals from a magnetic record tape, the transducer should be operable at least as a playback head.

In operation, control signals are supplied to electrodes 2 and 6, relative to electrodes 3 and 5, having a polarity and magnitude sufficient to cause bi-morph leaf 1 to bend in the desired direction and by a desired amount. As shown in FIG. 1, piezo-ceramic element 4 exhibits a polarization in the direction indicated by the arrows; and piezo-ceramic element 7 exhibits a polarization in the opposite direction. An electric field which is applied across a piezo-ceramic element in the direction of its polarization results in a shrinking deformation thereof; and an electric field applied across a piezo-ceramic element in a direction opposite to its polarization results in an elongating deformation thereof. If piezo-ceramic element 4 is elongated, or stretches, while piezo-ceramic element 7 shrinks, the resultant bending of bi-morph leaf 1 is in the downward direction. Conversely, if piezo-ceramic element 4 shrinks while piezo-ceramic element 7 stretches, the resultant bending of bi-morph leaf 1 is in the upward direction. From FIG. 2, it is seen that the drive signals which are applied across piezo-ceramic elements 4 and 7, respectively, are in the form of electrical voltages which apply electric fields that are opposite to and in the same direction as the polarizations of these respective piezo-ceramic elements. Consequently, bi-morph leaf 1 bends in the downward direction, as shown. It is seen, therefore, that transducer 10 is displaced by a corresponding amount determined by the downard bending of the bi-morph leaf. It will be recognized that, if the polarities of the drive signals supplied to bi-morph leaf 1 are reversed, the bi-morph leaf will bend in the upward direction.

Figure 3:
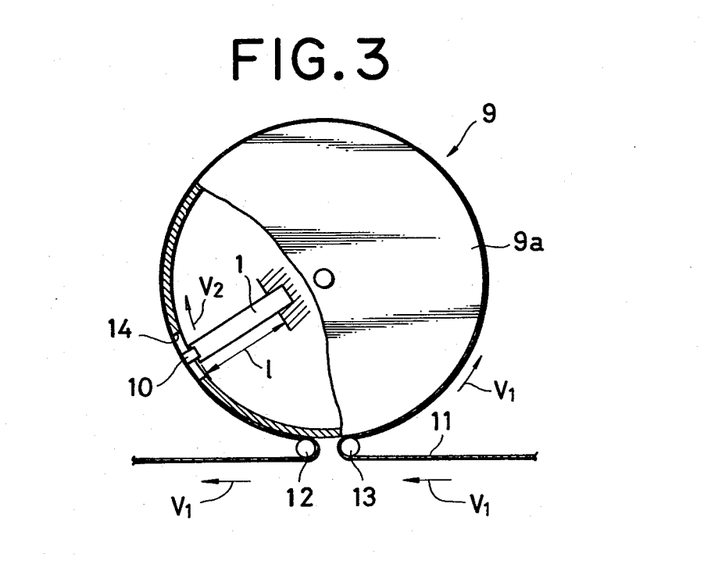
FIG. 3 is a plan view illustrating the manner in which the deflectable transducer mounting assembly shown in FIG. 2 is mounted on the rotary head drum of a VTR.
Figure 4:
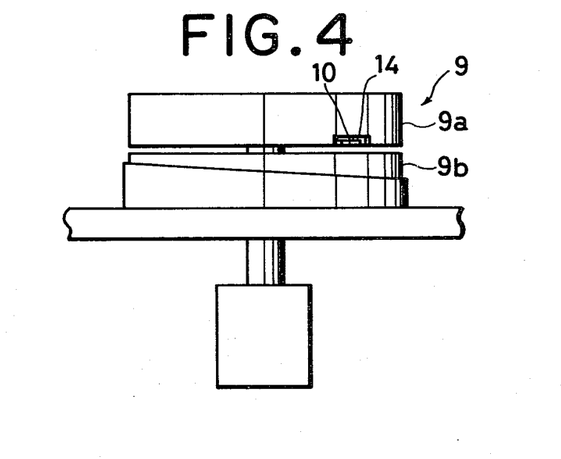
FIG. 4 is a front view of the apparatus shown in FIG. 3.
Figure 5:
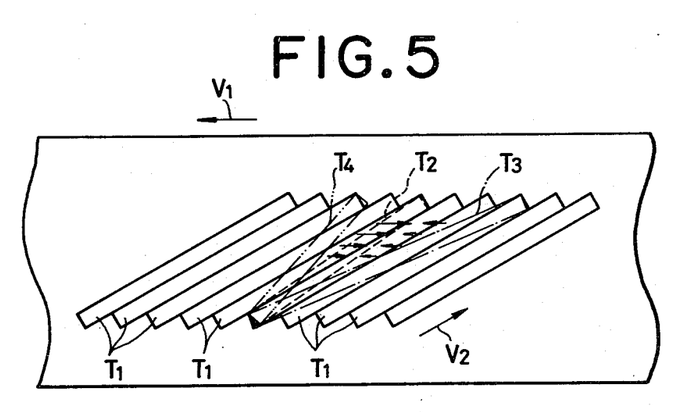
FIG. 5 is a schematic representation of record tracks formed on a magnetic tape used in a VTR.

As illustrated in FIGS. 3 and 4, bi-morph leaf 1 is secured to rotary drum 9a of rotary head drum assembly 9. A magnetic tape 11 is guided by suitable guide rollers 12 and 13 to be helically wrapped about a circumferential portion of rotary head drum assembly 9 so as to subtend an arcuate span of about 340°. When tape 11 is transported in the direction illustrated by the arrows shown in FIG. 3, a given point on the tape helically moves from stationary guide drum 9b about the rotary head drum assembly. Consequently, when rotary drum 9a is driven, transducer 10, which projects from a slit 14 in the rotary drum, scans an oblique trace across the surface of the helically wrapped tape. Successive ones of these tracks are illustrated as tracks $T_1$ in FIG. 5. Depending upon the deflection, or bending, of bi-morph leaf 1, transducer 10 is displaced in a direction parallel to the axis of rotary head drum assembly 9 so as to be movable in a direction substantially transversely of a scanned track $T_1$. In FIGS. 3-5, it is assumed that tape 11 is transported at the speed $V_1$, and that transducer 10 is rotary driven so as to exhibit the peripheral speed $V_2$. Suitable tape-transport means and rotary drive means (not shown) are used to drive tape 11 and transducer 10.

With reference to FIG. 5, it may be seen that, during a normal reproducing mode wherein magnetic tape 11 is driven at the speed $V_1$, each scanning trace of transducer 10 is in substantial alignment with each of previously recorded tracks $T_1$. However, during special reproducing modes, such alignment may not be present. In particular, when the magnetic tape is driven at a relatively slow speed, such as at a speed equal to $V_1/2$, $V_1/3$ . . . , or when the magnetic tape is stopped so as to execute a still reproducing mode, the resultant trace of the transducer across the magnetic tape may appear as trace $T_2$, shown in broken lines. It is readily seen that this trace $T_2$ does not coincide with a previously recorded track $T_1$. Accordingly, for proper reproduction of the video signals with minimal "noise", bi-morph leaf 1 must be controllably deflected so as to bring trace $T_2$ into alignment with a respective one track $T_1$. In FIG. 5, this alignment is attained by supplying drive signals to bi-morph leaf 1 which would result in a downward bending, or deflection, of the bi-morph leaf.

A similar tracking-error problem occurs when the magnetic tape is driven in a fast reproducing mode. In this mode, wherein the tape is driven at a speed of, for example, $3V_1$, the scanning trace of transducer 10 across the magnetic tape appears as trace $T_3$. However, this trace can be brought into alignment with a respective one track $T_1$ by, for example, gradually deflecting bi-morph leaf 1 in the upward direction during each scanning trace. Alternatively, the bi-morph leaf may be deflected in the downward direction during the first half of its scanning trace, and then the bi-morph leaf may be deflected in the upward direction during the second half of its trace. This too results in bringing trace $T_3$ into alignment with a single record track $T_1$.

When the magnetic tape is driven in the reverse direction at, for example, the tape transport speed of $-2V_1$ so as to execute the reverse reproducing mode, the resultant scanning trace of transducer 10 across the tape appears as trace $T_4$. It is seen that, to bring trace $T_4$ into alignment with a respective record track $T_1$, bi-morph leaf 1 must be driven so as to bend in the downward direction. However, when trace $T_4$ is compared to either trace $T_2$ or trace $T_3$, it will be appreciated that this bending of the bi-morph leaf during the reverse reproducing mode must be greater than the bending of the bi-morph leaf during either the slow-motion or fast-motion reproducing modes. That is, transducer 10 must be subjected to a greater displacement during the reverse reproducing mode than during the slow-motion, stop-motion or fast-motion reproducing modes in order to bring the transducer into alignment with a previously recorded record track. This large amount of deflection requires either drive signals of relatively high magnitudes or a longer bi-morph leaf. As mentioned above, large drive signals may result in cracking or breaking the bi-morph leaf. A longer bi-morph leaf exhibits a lower natural resonant frequency, thereby reducing the speed of response thereof. Hence, deflectable transducer mounting assemblies of the type shown in FIGS. 1–4 may not operate satisfactorily during all types of special reproducing modes of operation.

Figure 6:
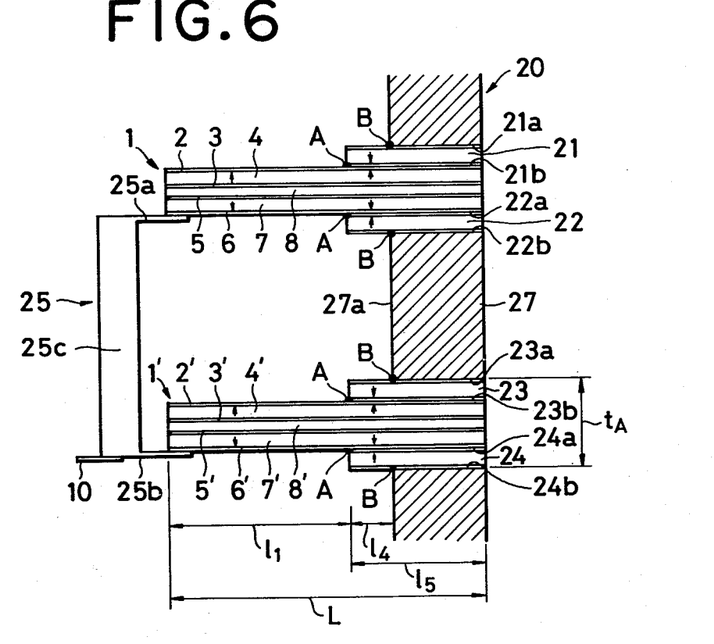
FIG. 6 is a side view of one embodiment of the deflectable transducer mounting assembly of the present invention.

The aforenoted problem is overcome by the present invention, one embodiment of which is illustrated in FIG. 6. In this embodiment, transducer mounting assembly 20 is comprised of a pair of similar bi-morph leaves 1, 1', each bi-morph leaf having one end secured to a support member 27, which may comprise a mounting portion of rotary drum 9a, and an opposite free end. Bi-morph leaves 1 and 1' may be similar to the bi-morph leaf shown in FIG. 1, with like elements being identified by the same reference numerals, and wherein those elements which constitute bi-morph leaf 1' being identified by primed reference numerals.

The one end of bi-morph leaf 1 which is to be secured to mounting portion 27 is sandwiched between a pair of single-morph leaves 21 and 22. Similarly, the one end of bi-morph leaf 1' which is to be secured to mounting portion 27 is sandwiched between another pair of single-morph leaves 23 and 24, respectively. Single-morph leaf 21, for example, is formed of piezo-ceramic material whose direction of polarization is indicated by the arrows shown in FIG. 6. The piezo-ceramic material may be thought of as having upper and lower surfaces in the view shown in FIG. 6. The upper surface of this piezo-ceramic element is coated with an electrode 21a and, similarly, the bottom surface of this piezo-ceramic element is coated with an electrode 21b. In FIG. 6, the direction of polarization of the piezo-ceramic material which is included in single-morph leaf 21 extends in the direction from electrode 21a to electrode 21b.

Likewise, single-morph leaf 22 includes a piezo-ceramic element whose upper and lower surfaces are coated with electrodes 22a and 22b, respectively, and whose direction of polarization extends from electrode 22b to electrode 22a. Single-morph leaf 23 includes a piezo-ceramic element whose upper and lower surfaces are coated with electrodes 23a and 23b, respectively, and whose direction of polarization extends from electrode 23a to electrode 23b. Finally, single-morph leaf 24 includes a piezo-ceramic element whose upper and lower surfaces are coated with electrodes 24a and 24b, respectively, and whose direction of polarization extends from electrode 24b to electrode 24a.

Single-morph leaves 21, 22 and 23, 24 are affixed to mounting portion 27 and, thus, serve to secure bi-morph leaves 1 and 1', respectively, to this mounting portion. It is seen from FIG. 6, that both the bi-morph leaves and the single-morph leaves are cantilevered outward from the mounting portion of the rotary drum.

Electrodes 2 and 21b, as well as electrodes 6 and 22a, are in contact with each other. Preferably, the electrodes of bi-morph leaf 1 are attached to these contacting electrodes of single-morph leaves 21 and 22 by a suitable adhesive. Likewise, electrodes 2' and 23b, as well as electrodes 6' and 24a, are in contact with each other. Preferably, the electrodes of bi-morph leaf 1' are attached to these contacting electrodes of single-morph leaves 23 and 24 by a suitable adhesive.

The directions of polarization of single-morph leaves 21 and 22 are opposite to each other and also to the directions of polarization of piezo-ceramic elements 4 and 7, respectively. Similarly, the directions of polarization of single-morph leaves 23 and 24 are opposite to each other and also to the directions of polarization of piezo-ceramic elements 4' and 7', respectively. Such polarization directions are indicated by the illustrated arrows. In addition to the electrical contact between the respective contacting electrodes of the single-morph leaves and the bi-morph leaves illustrated in FIG. 6, conducting leads serve to electrically interconnect electrodes 6 and 21a, as well as electrodes 2 and 22b, respectively. Likewise, electrical conducting leads serve to electrically interconnect electrodes 2' and 24b and electrodes 6' and 23a, respectively. Such electrical conducting leads are illustrated for bi-morph leaf 1 and single-morph leaves 21 and 22, for example, in FIGS. 8 and 9.

Figure 7:
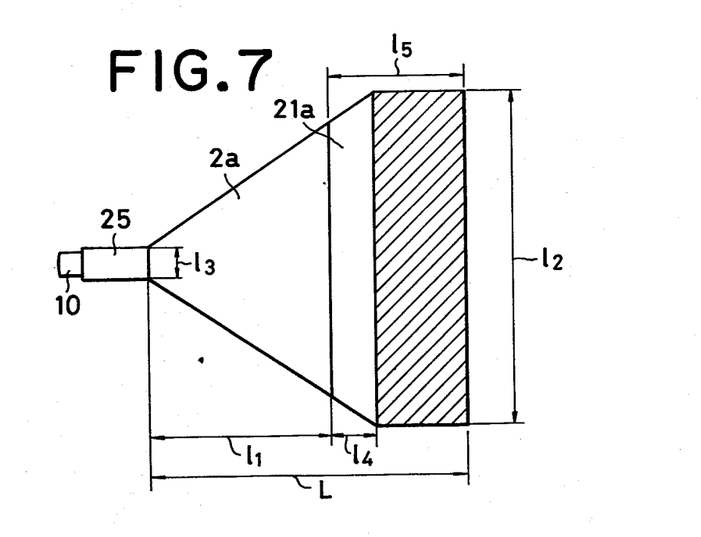
FIG. 7 is a top plan view of one of the deflectable support elements shown in FIG. 6.

FIG. 7 is a top plan view of, for example, bi-morph leaf 1 in combination with single-morph leaves 21 and 22. Preferably, the combination of single-morph leaf 1 and bi-morph leaves 21, 22 exhibits a substantially triangular shape in plan view, rather than a simple rectangular configuration.

The free ends of bi-morph leaves 1, 1' are interconnected by a substantially U-shaped support element 25. Legs 25a and 25b of support element 25 are relatively flexible, and cross-piece 25c is relatively rigid. Transducer 10 is secured to rigid cross-piece 25c. The purpose of support member 25 will be apparent from the description set out below.

Figure 8:
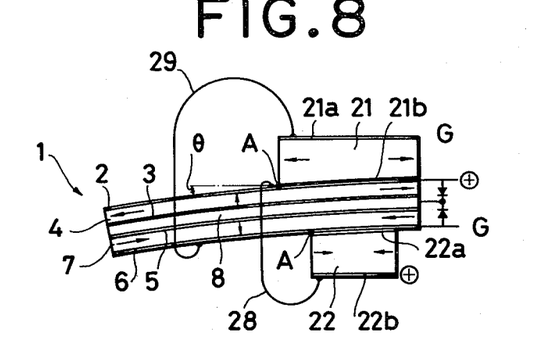
FIGS. 8 and 9 are side views representing the manner in which one of the deflectable elements shown in FIG. 6 responds to drive signals applied thereto.
Figure 9:
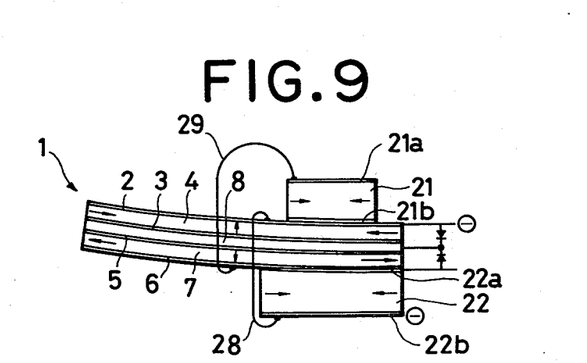

As shown in FIGS. 8 and 9, electrical conducting lead 28 interconnects electrodes 2 and 22b, and electrical conducting lead 29 interconnects electrodes 6 and 21a. When the illustrated deflectable transducer mounting assembly is coupled to electrical drive circuitry, ground potential (G) is applied to electrode 6 and either a positive or negative drive signal voltage is applied to electrode 2. With respect to bi-morph leaf 1', ground potential (G) supplied to electrode 6' and positive or negative drive signal voltage is applied to electrode 2'. Preferably, oppositely poled diodes are interconnected between electrodes 2 and 6 (and between electrodes 2' and 6') so as to insure a unidirectional electric field across piezo-ceramic elements 4 and 7, the direction of which field is determined by the polarity of the drive signal voltage applied to electrode 2. As illustrated, the common-connected cathodes of these diodes are coupled to shim 8.

When a positive drive signal voltage is applied to electrode 2 and ground potential (G) is applied to electrode 6 of bi-morph leaf 1, as shown in FIG. 8, the electrical interconnections between the bi-morph and single-morph leaves, as well as the particular directions of polarization of the respective piezo-ceramic elements results in an electric field across piezo-ceramic element 4 which is opposite to the direction of polarization thereof, an electric field applied acros piezo-ceramic element 7 which is in the same direction as its polarization, an electric field across single-morph leaf 21 which is opposite to the direction of polarization of the piezo-ceramic material included therein, and an electric field across single-morph leaf 22 which is in the same direction as the polarization of the piezo-ceramic material included therein. Consequently, piezo-ceramic element 4 as well as single-morph leaf 21 undergo expansive deformations; whereas piezo-ceramic element 7 as well as single-morph leaf 22 undergo contractive deformations. As a result thereof, bi-morph leaf 1 bends in the downward direction, as illustrated. It is appreciated that single-morph leaves 21 and 22 also undergo a downward bending.

If the polarity of the drive signal voltages is reversed, as shown in FIG. 9, piezo-ceramic element 4 as well as single-morph leaf 21 undergo contractive deformations, while piezo-ceramic element 7 and single-morph leaf 22 undergo expansive deformations. As a result, bi-morph leaf 1 bends in the upward direction. Single-morph leaves 21 and 22 also undergo an upward bending.

Points A, shown in FIGS. 6, 8 and 9, define the points of attachment between single-morph leaves 21 and 22 and bi-morph leaf 1 sandwiched therebetween. The bi-morph leaf deflects by an angular amount Θ, as shown in FIG. 8, in response to the drive signal supplied thereto. Let it be assumed that this is the same angular deflection that bi-morph leaf 1 illustrated in FIG. 1 would undergo in response to the very same drive signal. However, in the presently described embodiment, it is appreciated that single-morph leaves 21 and 22 also undergo an angular deflection with respect to attachment points B (FIG. 6) in response to the drive signal supplied thereto. Consequently, attachment points A may be considered to be pre-deflected in response to the deflection of single-morph leaves 21 and 22. Hence, the free end of bi-morph leaf 1 is seen to be deflected, or displaced, by an amount which is greater than the deflection thereof in the arrangement shown in FIG. 2. That is, by the present invention, a greater deflection is attained by a bi-morph leaf, having the same length as that shown in FIG. 2 in response to a drive signal of equal magnitude. In particular, and with reference to FIGS. 6 and 7, the actual deflection of the free end of, for example, bi-morph leaf 1 is equal to the deflection of portion $l_1$ of its length plus the deflection of portion $l_4$ of the length of the single-morph leaves. The deflection of the single-morph leaves results in an amplification of the deflection of the free end of bi-morph leaf 1. Thus, the effective length of bi-morph leaf 1 which contributes to the displacement of the free end thereof is equal to portions $l_1 + l_4$. This effective length is seen to be equal to the length from the free end of bi-morph leaf 1 to attachment point B whereat single-morph leaves 21 and 22 are secured to mounting portion 27 of the rotary drum assembly. Stated otherwise, when the assembly shown in FIG. 6 is compared to that shown in FIG. 2, the bi-morph leaf of FIG. 6 exhibits an effective length which is greater than the effective length of the bi-morph leaf of FIG. 2 by $l_4$. Therefore, if the overall length of bi-morph leaf 1 is represented as L (FIG. 6), then the deflection of the free end thereof is greater for the same drive signal magnitude supplied thereto, as compared to the bi-morph leaf assembly shown in FIG. 2. Consequently, the actual length of bi-morph leaf need not be very large and, hence, the natural resonant frequency thereof may be maintained at a desirably high level. Therefore, the vibration sensitivity of transducer 10 is significantly improved.

Typical dimensions for the deflectable assembly illustrated in FIGS. 6 and 7 are as follows: the overall width $l_2$ of the one end of bi-morph leaf 1 which is sandwiched between single-morph leaves 21 and 22 and which is secured to mounting portion 27 is on the order of about 26 mm; the width $l_3$ of the free end of bi-morph leaf 1 to which support member 25 is secured is on the order of about 4 mm, the length $l_4$ of single-morph leaves 21, 22, 23 and 24 which extends beyond surface 27a of mounting portion 27 is on the order of 7 mm, the overall length $l_5$ of the single-morph leaves is on the order of 16 mm, and the thickness of each of piezo-ceramic elements 4, 7, and the elements which are included in single-morph leaves 21 and 22 is on the order of 190μ. With the addition of deflectable elements 21, 22 and 23, 24, transducer 10 undergoes a deflection which is increased by about 200μ over the deflection which otherwise would be obtainable in the absence of such additional deflectable elements. That is, the use of these additional deflectable elements amplifies the deflection of transducer 10 by an additional 200μ. Hence, with the embodiment shown in FIGS. 6–9, transducer 10 may be deflected, or displaced, through a distance of about 700μ. This is compared to a displacement of about 460μ which is attainable by transducer 10 in the embodiment shown in FIG. 2 for a bi-morph leaf of equal length and for a drive signal of equal magnitude.

In the embodiment of FIG. 6, for example, the resonant frequency of bi-morph leaf 1 is a function of length $l_1$, that is, the length of the bi-morph leaf from its point of attachment A with the single-morph leaves to the free end thereof, the additional length $l_4$, which is equal to the length by which the single-morph leaves project from surface 27a of mounting portion 27, and the overall thickness $t_4$ of the bi-morph leaf plus the single-morph leaves between which the bi-morph leaf is sandwiched (wherein $t_4$ is on the order of about 1.55 mm). It may be appreciated that this thickness $t_4$ of the mounting portion of the deflectable assembly is about twice the thickness of bi-morph leaf 1. When the projecting length $l_4$ of the single-morph leaves is relatively small, such as on the order of about 5 to 7 mm, the overall transducer mounting assembly 20 is relatively rigid, whereupon the resonant frequency thereof is satisfactorily high.

In the illustrated embodiment, the resonant frequency of bi-morph leaf 1 is determined, to a large extent, by the length $l_1$ thereof. Likewise, the amount of deflection of the bi-morph leaf also is determined, to a large extent, by its length $l_1$. Hence, the deflection and resonant frequency of the bi-morph leaf may be changed by correspondingly changing the location of attachment points A at which the single-morph leaves are attached to the bi-morph leaves. Since the single-morph leaves undergo deflection in response to the drive signals supplied thereto, if attachment points A are shifted to the left, for example, both the amount of displacement of transducer 10 as well as the resonant frequency of the bi-morph leaves will be increased.

It will be appreciated that it is advantageous to attach cross-piece 25c of support member 25 to the free ends of bi-morph leaves 1 and 1' through relatively flexible legs 25a and 25b, respectively. The use of such flexible legs tends to maintain cross-piece 25c, as well as transducer 10 mounted thereon, in relatively fixed alignment with respect to the magnetic tape, notwithstanding the deflection of bi-morph leaves 1 and 1'. Consequently, the face of transducer 10 remains substantially in parallel with the surface of the magnetic tape. Therefore, the so-called contact angle between the face of the transducer and the magnetic tape may remain substantially constant, thereby permitting a desirable contact angle to be maintained.

In the transducer mounting assembly shown in FIG. 2, stress is concentrated in the area of piezo-ceramic elements 4 and 7 in the vicinity of support member 9a to which these elements are secured. Hence, when the bi-morph leaf shown in FIG. 2 undergoes a relatively large deflection, such stress concentration may become sufficient to crack the piezo-ceramic elements. However, in the deflectable transducer mounting assembly shown in FIG. 6, single-morph leaves 21–24 expand and contract in response to the drive signals supplied thereto so as to relieve the stress concentrations in the bi-morph leaves at the vicinity of attachment points A. By reducing the stress in piezo-ceramic elements 4, 7 and 4', 7', serious damage thereto is avoided. Although stress concentration may be present in the single-morph leaves 21–24 in the vicinity of attachment points B at which such single-morph leaves are secured to mounting portion 27, it is recognized that, when the single-morph leaves bend in response to drive signals supplied thereto, the radius of curvature of that portion $l_4$ which undergoes deflection is on the order of about 4 to 5 times the radius of curvature of length $l_1$ of the bi-morph leaves 1, 1'. Since the stress concentration is a function of the radius of curvature of the bending portion of the piezo-ceramic material, the fact that the radius of curvature of the deflection of the single-morph leaves is relatively large means that there is little danger that the single-morph leaves may crack.

Preferably, bi-morph leaves 1, 1' and single-morph leaves 21–24 are constructed of the same piezo-ceramic material. Hence, the coefficient of thermal expansion of piezo-ceramic elements 4, 7, 4', 7' and the piezo-ceramic elements which constitute the single-morph leaves all are equal. Therefore, there is no deflection of the free end of deflectable mounting assembly 20 in response to changes in temperature. Accordingly, transducer 10 is maintained at a relatively fixed, predetermined position unless and until an electric field is applied across the piezo-ceramic elements. It will be recognized, therefore, that the vibration characteristics of deflectable mounting assembly 20 do not change as a function of changes in temperature.

Figure 10:
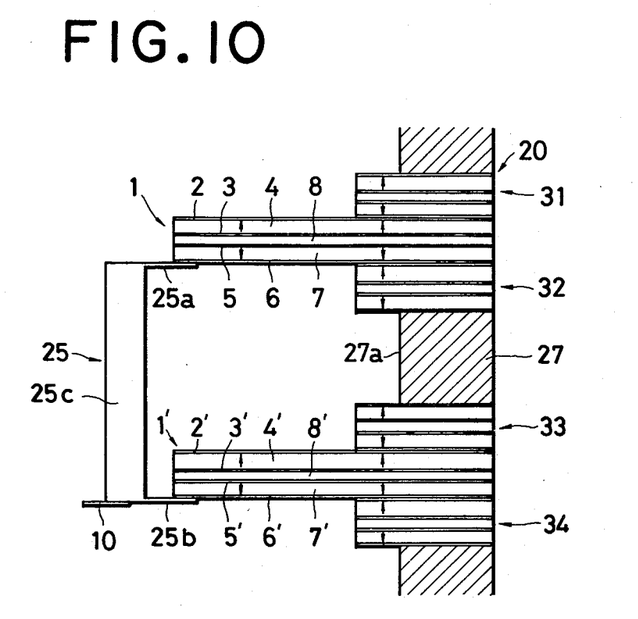
FIG. 10 is a side view of another embodiment of the deflectable transducer mounting assembly of the present invention.

Another embodiment of the deflectable transducer mounting assembly of the present invention is illustrated in FIG. 10. This embodiment is similar to the assembly shown in FIG. 6, except that single-morph leaves 21, 22, 23 and 24 are replaced by bi-morph leaves 31, 32, 33 and 34, respectively. To avoid confusion in the present description, bi-morph leaves 31–34 are referred to as additional bi-morph leaves. It should be appreciated that, if desired, all of the illustrated bi-morph leaves may be obtained by forming one relatively long bi-morph leaf and then sectioning that single bi-morph leaf into the illustrated, separate leaves, as desired. One end of bi-morph leaf 1 is sandwiched between the pair of additional bi-morph leaves 31 and 32, and one end of bi-morph leaf 1' is sandwiched between the pair of additional bi-morph leaves 33 and 34, respectively. The pair of additional bi-morph leaves 31 and 32 serves to secure bi-morph leaf 1 to mounting portion 27; and the pair of additional bi-morph leaves 33 and 34 serves to secure bi-morph leaf 1' to the mounting portion.

Although not shown herein, it will be appreciated that suitable drive signals are supplied to the respective bi-morph leaves so as to impart deflection thereto. Since the pair of bi-morph leaves 31 and 32 bend in response to such drive signals, the bending thereof tends to amplify the bending, or displacement, of the free-end of bi-morph leaf 1. Similarly, the bending of the pair of bi-morph leaves 33 and 34 in response to drive signals tends to amplify the bending, or deflection, of the free end of bi-morph leaf 1'. Hence, the displacement of transducer 10 may be increased without increasing the actual length of bi-morph leaves 1 and 1'. Also, this increase in displacement of the transducer is not accompanied by an undesired reduction in the resonant frequency of mounting assembly 20.

Figure 11:
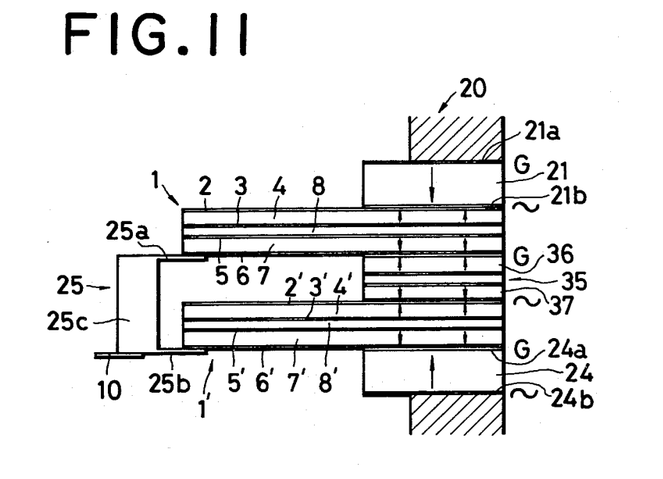
FIG. 11 is a side view of a still further embodiment of a deflectable transducer mounting assembly in accordance with this invention.

Yet another embodiment of deflectable transducer mounting assembly 20 is illustrated in FIG. 11. This embodiment is similar to that discussed hereinabove with respect to FIG. 6, except that single-morph leaves 22 and 23 are replaced by a bi-morph leaf 35, this bi-morph leaf including piezo-ceramic elements 36 and 37 which serve substantially the same purpose as aforedescribed single-morph leaves 22 and 23. Thus, bi-morph leaves 1 and 1' are spaced in closer proximity to each other such that one end of bi-morph leaf 1 is sandwiched between piezo-ceramic element 36 of additional bi-morph leaf 35 and single-morph leaf 21; and one end of bi-morph leaf 1' is sandwiched between piezo-ceramic element 37 of the additional bi-morph leaf 35 and single-morph leaf 24, as illustrated. A suitable adhesive may be used to join electrodes 2 and 21b, electrode 6 and the electrode coated upon piezo-ceramic element 36, electrode 2' and the electrode coated on piezo-ceramic element 37, and electrodes 6' and 24a.

It will be recognized that electrodes 6 and 21a are interconnected by a conducting lead (not shown) and, similarly, electrodes 2' and 24b are interconnected by a conducting lead (not shown). During operation, ground potential (G) is applied to electrodes 6 and 21a, and also to electrodes 6' or 24a. A drive signal, of either positive or negative polarity, is applied to electrode 2 and also to electrodes 2' and 24b. Thus, depending upon the magnitude and polarity of such drive signals, bi-morph leaves 1 and 1' deflect, additional bi-morph leaf 35 also deflects, and single-morph leaves 21 and 24 selectively expand or contract so as to impart an amplified displacement to transducer 10, similar to the amplified displacement discussed hereinabove.

While the present invention has been particularly shown and described with reference to certain preferred embodiments, it will be readily apparent to those of ordinary skill in the art that various changes and modifications in form and details may be made without departing from the spirit and scope of the invention. It is intended that the appended claims be interpreted as including all such changes and modifications.

What is claimed is:

1. A deflectable transducer mounting assembly for mounting a transducer on a member, comprising first deflectable means having a first end to be coupled to said member so as to be cantilevered therefrom and a free end on which said transducer is mounted, said first deflectable means being deflectable in response to drive signals supplied thereto; and a pair of second deflectable means being deflectable in response to drive signals supplied thereto, said pair of second deflectable means being disposed at said first end of said first deflectable means to sandwich said first end therebetween and, when assembled with said member, said pair of second deflectable means is secured to said member.

2. The assembly of claim 1 wherein said first deflectable means comprises a bi-morph leaf; and said second deflectable means comprise respective single-morph leaves including piezo-ceramic material polarized in opposite directions.

3. The assembly of claim 2 wherein said bi-morph leaf is provided with first and second electrodes on first and second surfaces thereof, respectively, wherein each of said single-morph leaves is provided with first and second electrodes on first and second surfaces of said piezo-ceramic material, respectively; one electrode of each of said single-morph leaves being in contact with a respective electrode of said bi-morph leaf at said first end of the latter, and the other electrode of each of said single-morph leaves being electrically connected to the other respective electrode of said bi-morph leaf, whereby a drive signal applied across the electrodes of said bi-morph leaf also is applied across the electrodes of each of said single-morph leaves to cause deflection of said bi-morph and single-morph leaves in the same direction.

4. The assembly of claim 3 further comprising electrical conducting leads for connecting said other electrode of each of said single-morph leaves to said other respective electrode of said bi-morph leaf.

5. The assembly of claim 1 wherein said first deflectable means comprises a first bi-morph leaf; and said second deflectable means comprise respective second bi-morph leaves.

6. A deflectable transducer mounting assembly for mounting a transducer on a member, comprising a pair of first deflectable means each having a first end to be coupled to said member so as to be cantilevered therefrom and a free end which is deflectable with respect to said first end, said pair of first deflectable means being deflectable in response to drive signals supplied thereto; first and second pairs of second deflectable means being deflectable in response to drive signals supplied thereto, said first pair of second deflectable means being disposed at said first end of one of said pair of first deflectable means to sandwich said first end therebetween and said second pair of second deflectable means being disposed at said first end of the other of said pair of first deflectable means to sandwich said one end therebetween and, when assembled with said member, said first and second pairs of second deflectable means are secured to said member; and a support element flexibly coupled to the free ends of both of said pair of first deflectable means for receiving said transducer.

7. The assembly of claim 6 wherein said support element comprises a U-shaped element having relatively flexible legs coupled to the free ends of respective ones of said pair of first deflectable means and a relatively rigid cross-piece from which said legs extend and on which said transducer is mounted.

8. The assembly of claim 6 wherein said pair of first deflectable means comprises a pair of parallel bi-morph leaves, both bi-morph leaves deflecting in the same direction in response to a drive signal supplied thereto.

9. The assembly of claim 8 wherein said first and second pairs of second deflectable means comprise first and second pairs of single-morph leaves, respectively, each pair of single-morph leaves including piezo-ceramic material polarized in opposite directions with respect to each other.

10. The assembly of claim 9 wherein each of said bi-morph leaves includes first and second electrodes and each pair of single-morph leaves includes first and second electrodes in contact with said first and second electrodes, respectively, of a respective bi-morph leaf and third and fourth electrodes electrically connected to said second and first electrodes, respectively, of said respective bi-morph leaf, whereby a drive signal supplied to a bi-morph leaf also is supplied to the pair of single-morph leaves coupled thereto so as to cause deflection of said bi-morph leaf and pair of single-morph leaves in the same direction.

11. The assembly of claim 8 wherein said first and second pairs of second deflectable means comprise second and third pairs of bi-morph leaves, respectively, said second pair of bi-morph leaves having said first end of a first of said first-mentioned pair of bi-morph leaves sandwiched therebetween, and said third pair of bi-morph leaves having said first end of a second of said first-mentioned pair of bi-morph leaves sandwiched therebetween.

12. The assembly of claim 8 wherein said first and second pairs of second deflectable means comprise an additional bi-morph leaf sandwiched between and in contact with said first ends of both of said pair of bi-morph leaves, a first single-morph leaf cooperating with said additional bi-morph leaf to have said first end of a first of said pair of bi-morph leaves sandwiched therebetween, and a second single-morph leaf cooperating with said additional bi-morph leaf to have said first end of a second of said pair of bi-morph leaves sandwiched therebetween.

13. The assembly of claim 12 wherein said first and second single-morph leaves include piezo-ceramic material polarized in opposite directions with respect to each other.

14. The assembly of claim 13 wherein said first of said pair of bi-morph leaves includes an electrode and said first single-morph leaf includes an electrode in contact with the electrode of said first of said pair of bi-morph leaves; and wherein said second of said pair of bi-morph leaves includes an electrode and said second single-morph leaf includes an electrode in contact with the electrode of said second of said pair of bi-morph leaves.

15. The assembly of claim 14 wherein said first and second of said pair of bi-morph leaves include further electrodes and said additional bi-morph leaf includes electrodes in contact with respective ones of said further electrodes.

* * * * *